(12) United States Patent
Salmon (10) Patent No.: US 7,535,107 B2
(45) Date of Patent: May 19, 2009

(54) TILED CONSTRUCTION OF LAYERED MATERIALS

(75) Inventor: Peter C. Salmon, Mountain View, CA (US)

(73) Assignee: Salmon Technologies, LLC, Mountain View, CA (US)

( * ) Notice: Subject to any disclaimer, the term of this patent is extended or adjusted under 35 U.S.C. 154(b) by 320 days.

(21) Appl. No.: 11/249,909

(22) Filed: Oct. 12, 2005

(65) Prior Publication Data

US 2006/0103024 A1 May 18, 2006

Related U.S. Application Data

(60) Provisional application No. 60/617,718, filed on Oct. 12, 2004.

(51) Int. Cl.
*H01L 23/48* (2006.01)
(52) U.S. Cl. .............. 257/760; 257/736; 257/758; 257/774; 257/E33.062
(58) Field of Classification Search ........... 257/736, 257/758, 760, 774
See application file for complete search history.

(56) References Cited

U.S. PATENT DOCUMENTS

| 5,072,075 | A  | * | 12/1991 | Lee et al. ............... 174/264 |
| 6,893,716 | B2 |   | 5/2005  | McGimpsey et al. |
| 6,955,853 | B1 |   | 10/2005 | Tran et al. |
| 6,962,872 | B2 | * | 11/2005 | Chudzik et al. ......... 438/626 |
| 6,984,530 | B2 |   | 1/2006  | Lee et al. |
| 6,990,176 | B2 |   | 1/2006  | Sherman et al. |

* cited by examiner

*Primary Examiner*—Wai-Sing Louie
(74) *Attorney, Agent, or Firm*—Dorsey & Whitney LLP (57) ABSTRACT

A method is described for combining the diverse strengths of two materials in a tiled film construction. The first material provides a foundation of intersecting grid lines on a substrate and the second material is contained within the grid lines and has a valued property for a particular application. In a preferred embodiment, a tiled dielectric layer has improved low-k dielectric performance while avoiding film stress problems that can lead to delamination or cracking. CTE mismatch is overcome at the cost of an additional masking step. This tiling method and layered binary construction enable Cytop to be used as a high performance low-k dielectric on most substrates including semiconductor wafers and copper panels or foils.

14 Claims, 5 Drawing Sheets

TILED CONSTRUCTION OF LAYERED MATERIALS

RELATED APPLICATIONS

This application claims priority under 35 U.S.C. § 119(e) to Provisional Application Ser. No. 60/617,718 filed Oct. 12, 2004, the disclosure of which is hereby incorporated by reference in its entirety.

BACKGROUND OF THE INVENTION

1. Field of the Invention

This invention relates to methods for forming layers of binary material on substrates, and more particularly to high-performance dielectrics and methods of fabrication.

2. Description of the Related Art

Layered constructions are well known for forming materials into useful composites. An example is a printed wiring board (PWB) with repeating layers of conductive traces embedded in dielectric material. A design problem occurs when a material has a desirable first property, but is disqualified in a particular application due to incompatibility with the substrate or an undesirable second property. For example, it will be shown that Cytop (an amorphous fluoropolymer) has exceptional dielectric properties but cannot be used in a conventional way with common substrate materials because of its high coefficient of thermal expansion (CTE).

Accordingly, there is a need for further development in forming materials on substrates for high performance applications.

SUMMARY OF THE INVENTION

A grid of intersecting lines of a first material is formed on a substrate. This first material is selected for compatibility with the substrate and the width of the grid lines is typically minimized. The compatibility issue may or may not be temperature dependent. The most common incompatibility is an adhesion problem caused by film stress in the build-up layers on the substrate. A second material having a valued property is formed within islands formed by the intersecting lines of the first material. The objective is to overcome an adverse property of the desired second material while minimizing any adverse effects of the first material. The spacing between grid lines represents the edge length of the islands, and typically varies between 1 and 5 mm. Using regularly spaced orthogonal grid lines the longest linear dimension of an island is the diagonal which is 41% longer than the edge dimension, and it is this longer dimension that is used in stress calculations.

In a preferred embodiment, first material PI 2731 is chosen for its close CTE match with copper. PI 2731 will adhere well to the preferred copper substrate, even as the temperature is raised and lowered during temperature cycles. For each tiled dielectric layer on the copper substrate, PI 2731 is formed into intersecting grid lines that adhere well to the substrate or to layers previously fabricated on the substrate. Since the build-up layers are typically thin compared with the substrate, expansion behavior is normally dominated by the copper substrate element, with additional urging by the embedded copper conductors. Cytop is chosen as the second material for its excellent dielectric properties, and is deposited so as to form islands bounded by the grid lines of PI 2731. This tiled dielectric construction implements a robust interface with the underlying surface, while providing the best possible dielectric properties.

In some embodiments, a tiled layout can be created wherein critical high frequency circuits are modularized and each module lies within an island (tile), and connections between islands are simple "straight across" wirings.

Although the first and second materials typically differ with respect to their desired properties such as dielectric constant and loss factor, they may be similar in their physical properties such as soft-cured hardness. If so, they can be accurately patterned with embossing tools in such a manner that the binary character of the dielectric layer can be ignored during imprinting steps of the manufacturing process. That is, the embossing tool will create relief patterns in both first and second materials with equal facility.

Plasma etching may be employed to create trenches in dielectric structures, as part of a dual damascene process. Such a process is typically employed for the interconnection circuits built atop the transistor structures in ICs. If the etching rates of the first and second materials are similar, then photolithographic methods may be used for patterning the tiled dielectric structure of the current invention, for example to implement conductive traces and vias.

BRIEF DESCRIPTION OF THE DRAWINGS

Preferred embodiments of the invention are described below with reference to the following accompanying drawings.

FIG. 3 (a)-(f) presents cross-sectional views that illustrate a fabrication method for creating a multi-layer tiled film construction of the current invention.

FIG. 4 (a)-(e) continues the description of the fabrication process of FIG. 3.

FIG. 5 (a)-(e) continues the description of the fabrication process of FIGS. 3 and 4.

FIG. 6 (a)-(b) completes the description of the fabrication process of FIGS. 3-5.

DETAILED DESCRIPTION OF THE PREFERRED EMBODIMENTS

Various embodiments of the present invention are described hereinafter with reference to the figures. It should also be noted that the figures are only intended to facilitate the description of specific embodiments of the invention. They are not intended as an exhaustive description of the invention or as a limitation on the scope of the invention. In addition, an aspect described in conjunction with a particular embodiment of the present invention is not necessarily limited to that embodiment and can be practiced in any other embodiments of the present invention. For instance, in the following description, the tiled construction of the present invention is described with embodiments of low-k dielectric solutions. It will be appreciated that the claimed invention can be used not only for low-k dielectric solutions, but also any layered assembly wherein the elements are physically or thermally mismatched with each other, or with the substrate. These could include high-k dielectric or magnetic or superconducting or optical film assemblies, as examples. Although the preferred embodiments described herein are an interconnection circuit built up on copper, it will be appreciated that the same fabrication principles and results apply to tiled dielectric constructions for integrated circuits on semiconductor substrates.

PWBs include interconnection circuits formed in or on a substrate. The number of layers depends on the complexity of the circuit. The substrate is typically a glass-epoxy laminate, but recently The Berquist Company (Chanhassen, Minn., USA) and others have commercialized the build-up of interconnection circuits on metal substrates for high performance applications. A preferred embodiment of the current invention employs dielectric layers in a tiled construction using Cytop as a valued dielectric material, and copper as a preferred substrate material. Cytop is an amorphous fluoropolymer manufactured by Asahi Glass in Tokyo, Japan. It has outstanding electrical properties at high frequencies but also has a poor CTE match compared with most substrates.

A common method for applying dielectric materials to substrates is called spin-on dielectric (SOD). The base dielectric material is dissolved in a solvent to form a liquid. The liquid is dispensed onto a spinning wafer. Rotation speed and time are adjusted to achieve the desired thickness. Typically, the coating is then soft cured before patterning. The soft cure results in a non-rigid coating that is more easily patterned than a hard cured layer. Photolithographic patterning of the coating may be employed and the photo-definable characteristic of some dielectrics can make this step easier and more cost-effective. Alternatively it may be patterned using an embossing tool that is pressed into the surface of the soft-cured layer. Table 1 lists important electrical and physical properties of useful substrates and candidate dielectric materials:

TABLE 1

Material properties of substrates and candidate dielectric materials

| Use | Material | Dielectric Constant | Dissipation Factor | CTE (ppm/°C.) | Water Absorption |
|---|---|---|---|---|---|
| Substrate | Silicon | | | 2.5 | |
| Substrate & dielectric | FR-4 glass-epoxy | 3.9 | 0.015 | 17 | .05–0.10 |
| Substrate | Copper | | | 17 | |
| Dielectric | Silicon dioxide | 3.9 | 0.0004 | 0.5 | |
| Dielectric | PI 2731 | 3.0 | 0.002 | 16 | 1.5 |
| Dielectric | LCP | 2.9 | 0.002 | 17 | 0.04 |
| Dielectric | BCB | 2.65 | 0.0008 | 52 | 0.14 |
| Dielectric | Cytop | 2.1 | 0.0007 | 74 | <0.01 |

Silicon wafers are the most common semiconductor substrate for building integrated circuits (ICs). FR-4 is a glass-epoxy laminate that is used in the majority of PWBs manufactured today. A copper panel or foil may be employed as a PWB substrate, particularly for high power and/or high frequency applications. Copper's excellent thermal conduction helps to dissipate heat and its excellent electrical conduction can assist in providing a low-impedance ground plane. Silicon dioxide is typically thermally grown from silicon during wafer processing to create an isolating medium between conductive elements of ICs. PI 2731 is a photo-definable polyimide sold by HD Microsystems, Parlin, N.J., USA. Its expansion coefficient is well matched to copper, and a film thickness of 5-12 μm can be achieved using a single spin-on cycle. Liquid crystal polymer (LCP) is a new dielectric material available from Rogers Corporation of Chandler, Ariz., USA. Single-clad and double-clad laminates with LCP thicknesses of 25, 50, and 100 microns are available. As shown in Table 1 the material can be produced in a form that is thermally well matched to copper and FR-4 (x,y directions only). LCP is not available as a spin-on material, and the short list of available thicknesses may be limiting with respect to desired structures for controlled impedance transmission lines. Benzocyclobutene (BCB) is a popular spin-on dielectric sold by the Dow Company under the trade name of Cyclotene; it comes in both photo-sensitive and dry-etchable forms. Among the dielectrics, Cytop has clearly superior low-k properties.

The wiring layers of ICs and PWBs typically interconnect power supplies and ground as well as signals. The ability to lower the impedance of the power distribution system (PDS) is increasingly important as power supply voltages decrease, current draws increase, and the problem of "rail collapse" becomes critical for signals having fast edge rates (rise and fall times). The PDS impedance can be lowered using a thin dielectric layer having small loop inductance. A low-k material makes this possible because controlled impedance (typically 50 Ω) transmission lines are achievable using thin layers of low-k dielectric. The transmission lines are required for routing high speed signals at typical trace lengths for PWBs. For both ICs and PWBs, a low dielectric constant will result in lower trace capacitance and smaller RC delays. In addition, a low dissipation factor means that dissipative energy losses during signal propagation are reduced. The losses result from the polarized behavior of dielectrics and these losses typically cross over and exceed resistive losses at gigahertz frequencies.

In contrast to these advantages however, Cytop has a CTE of 74 parts per million per degree Centigrade (ppm/° C.). This is such a large mismatch with copper or glass-epoxy laminates having a CTE of 17 ppm/° C. that Cytop cannot be used with either; adhesion problems such as de-lamination or cracking will result during normal temperature cycles. The CTE mismatch is even worse for Cytop on silicon. The temperature cycles occur doing both manufacture and operation in the field. The water absorption characteristic is also included in Table 1 because absorbed water will increase the effective dielectric constant, thereby degrading the low-k properties.

Because RF signals operate at multi-gigahertz frequencies, they are particularly sensitive to dielectric constant and loss factor. Accordingly, the tiled dielectric construction enables higher performance RF circuits. For similar reasons it is well suited to high speed switchers and routers, multi-gigabit per second serial links, radar circuits and base station antennas.

For substrate/layer constructions where film stress is an issue, the problem may or may not be temperature dependent. An example of a non-temperature dependent case is a film that becomes highly stressed during curing by ultra-violet (UV) light. Whether temperature dependent or not, the maximum stress developed is proportional to the length of the interface. If the film stress is high and/or the sheet dimensions are large the interfacial stress can cause bowing or warping, plus adhesion problems leading to de-lamination or cracking. For the case of mismatched CTEs, this is commonly referred to as the "thermal mismatch problem." The current invention provides a solution by containing the stressed material within small islands, wherein the maximum strain accumulated over the largest linear dimension is insufficient to cause problems.

The concept of isolated islands can also be extended to include pastes or liquids as the second material. The first material then acts as a dam for a paste or liquid that has desirable properties. An example is an improved substrate for ink-jet printing wherein the droplets of ink are prevented from mixing by dams surrounding each pixel. The valued property is the color of the liquid inks (the second material); the first material provides a way to contain the inks and avoid color mixing at adjacent pixels. The incompatibility or unwanted property of the second material may be that it will run off the substrate if not captured by a dam. In addition, adjacent colors will mix if not separated by a physical barrier, reducing the capability to provide clear and vibrant colors. The dams provide a temporary but critical benefit; over a period of time ink solvents will evaporate and the remaining pigmented material will solidify.

Dual damascene copper interconnect structures have been developed for integrated circuits. They typically employ chemical mechanical polishing (CMP) to planarize the surface after each copper electroplating step. This is necessary because plating rates vary across a wafer and from wafer to wafer causing uneven topologies, and planar surfaces are required for high resolution photolithography using either contact or proximity alignment. Also, trace resistance variations at varying thicknesses may be unacceptable. Most low-k dielectrics are either too soft or too fragile to permit CMP without damage. The current invention can enable CMP processes by providing a stiff supporting matrix of intersecting grid lines; it may be desirable to harden them using a hard-bake prior to polishing.

Figure 1:
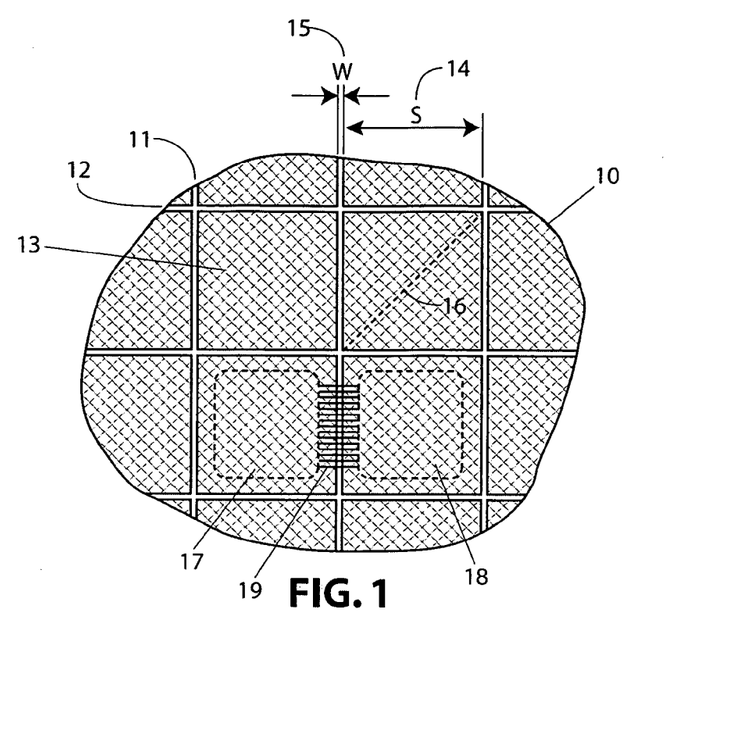
FIG. 1 is a partial top view of a tiled film construction of the current invention on a substrate.

FIG. 1 shows a substrate fragment 10 having grid lines 11 and 12 patterned on top. Grid lines 11 and 12 can be orthogonal. Grid lines 11 and 12 are formed of a first material that is compatible with substrate 10, especially with respect to adhesion and CTE. Thus, the grid lines form a foundational structure having good adhesion to substrate 10, even if temperature excursions occur. Photolithographic patterning is typically employed for creating the grid lines, using light exposed through a mask as is known in the art. The intersecting grid lines form islands 13 that are subsequently filled with a second material having a desired property or properties; in a preferred embodiment the desired properties are low dielectric constant and low dissipation factor. The spacing between grid lines S 14 is small enough that the accumulated stress in the second material along the diagonal 16 of the island is insufficient to cause problems. Spacing S 14 is typically in the range of 1-5 mm for common dielectric materials on common substrates. The grid lines are desirably only substantial enough to interrupt sheet behavior of the second material. Consequently, width W 15 can be arbitrarily small and is typically limited by the photolithographic system used to pattern the lines. For semiconductor wafers, width W 15 may be as small as a few nanometers. For dielectric layers of interconnection circuits on copper substrates described herein, width W 15 may be in the range of 1-10 μm for example, again depending on the photolithographic patterning system employed. Other methods may be employed to create the grid lines, such as deposition using an ink jet printer or extruding a bead of material in the required pattern.

FIG. 1 also shows a circuit module 17 in one island, separate from another circuit module 18 in an adjacent island. Connections between module 17 and module 18 are preferably simple "straight across" connections 19. This way, via structures will not be required at the grid lines, thereby avoiding potential processing inconsistencies when compared with vias in the second material contained within the islands. However, depending on the method used to pattern the dielectric layer (imprinting or plasma etching) and on the comparative properties of the first and second material (primarily hardness for imprinting and etch rate for plasma processing), it may be possible to fabricate circuit structures such as conductive traces and vias on substrate 10 without concern about the location of the grid lines. If such material-neutral patterning is achievable it will remove design constraints and simplify the design and layout process.

Figure 2:
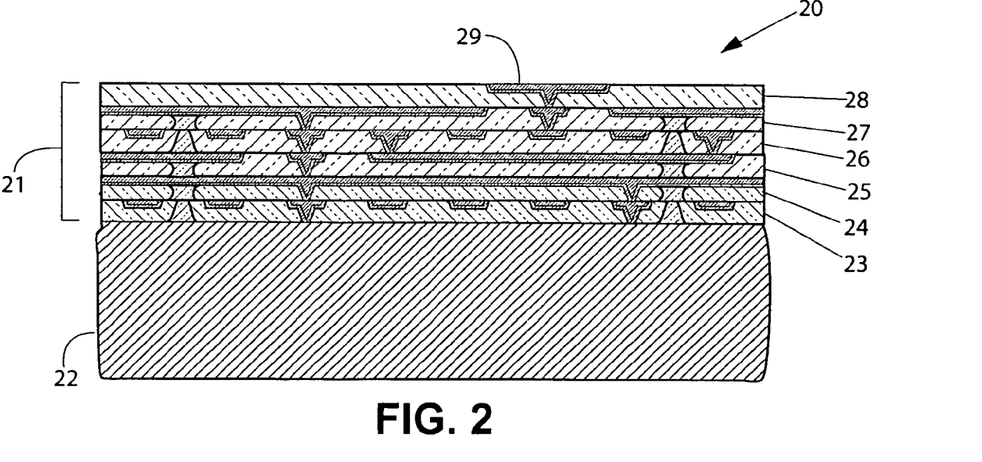
FIG. 2 is a cross-sectional view of a build-up interconnection circuit employing a tiled construction for some of the dielectric layers.

FIG. 2 depicts a PWB 20 employing a build-up process for creating interconnection circuits 21 on a copper substrate 22. Five dielectric layers 23-28 are illustrated. Layer 23 is a power distribution layer; layer 24 is a ground layer; layer 25 is a signal layer (x-direction); layer 26 is a second signal layer (y-direction); layer 27 is a second ground layer, and pad layer 28 includes input/output (I/O) pads 29. Fabrication details for constructing PWB 20 are described in reference to FIGS. 3-6.

Figure 3:
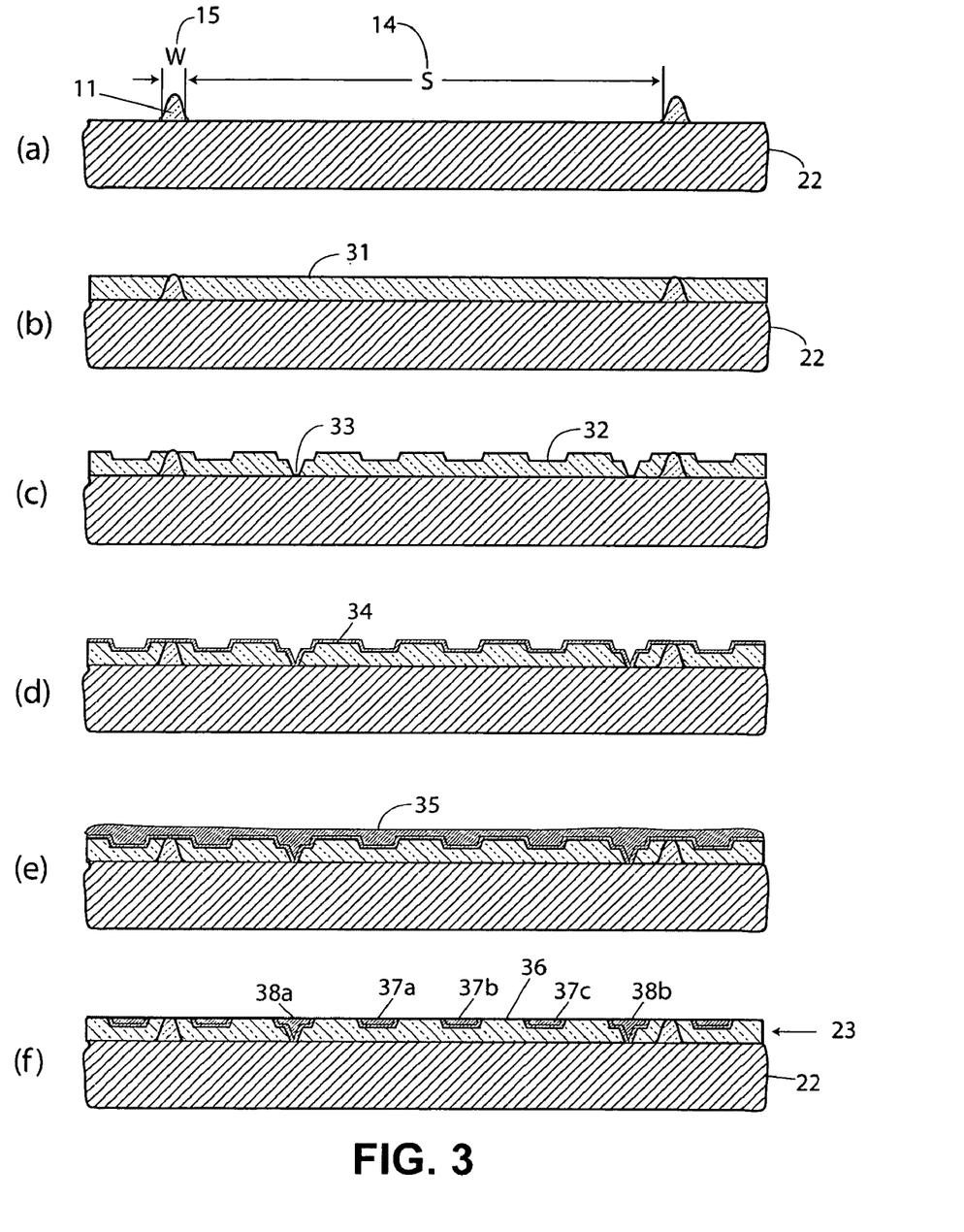

FIG. 3 teaches the first processing steps for creating PWB 20. FIG. 3(a) shows grid lines 11 formed on copper substrate 22, having a spacing S 14 and a width W 15. In the preferred embodiment, grid lines 11 are preferably formed by spin coating a first material such as PI 2731 on copper substrate 22. It is desirable that this first material is compatible with the substrate, especially as related to adhesion over anticipated temperature cycles. The PI 2731 spin-on dielectric is well matched to copper in CTE as listed in Table 1, and can be used for all of the grid lines described herein. Substrate 22 may have the form factor of a circular wafer or a rectangular panel. Currently available coaters and aligners can handle 300 mm wafers and also 300 mm square panels. An example coater is the ACS300 Plus and an example aligner is the MA300 Plus, both available from Suss Microtec of Garching, Germany. The PI 2731 is applied using such a coater, soft-cured on a hot plate, exposed using such an aligner, and developed to form grid lines 11; these photolithographic processes are known in the art.

In FIG. 3(b) second material 31 is preferably spin-coated on top of grid lines 11 and soft-cured prior to patterning. In a preferred embodiment, material 31 has a high dielectric constant such that bypass capacitors can be formed between power traces on this layer and the ground plane provided by copper substrate 22. A higher dielectric constant will result in higher value capacitors. Providing embedded bypass capacitors in this manner can improve high frequency performance of the PWB as well as eliminate the cost of discrete components (bypass capacitors). A suitable high-k material may be synthesized from a base material such as PI 2731 plus a high-k filler such as fine particles of barium titanate. The presence of the filler may change the CTE sufficiently to warrant using the tiled dielectric approach as shown, to avoid adhesion problems and potential cracking.

FIG. 3(c) shows patterns imprinted in high-k material 31 using an embossing tool, including shallow trenches 32 that will become conductive traces, and vias 33 that are deeper, and penetrate down to contact copper of the underlying layer. Typically, the penetration is not complete and a thin web of material remains. If present, this is removed by a clean-up plasma etch step using oxygen gas, revealing clean bare copper on the layer beneath that will function as a contact area or pad.

FIG. 3(d) shows a layer of seed copper 34 coating the relief pattern of FIG. 3(c). Typically seed layer 34 is coated by sputtering and includes titanium for adhesion, plus copper to provide the base for electroplating. Seed layer 34 will become the cathode of the electroplating process, attracting positively charged copper ions. A typical thickness for the Ti adhesion layer is 400 Angstroms and a typical thickness of sputtered copper is 800 Angstroms.

FIG. 3(e) shows the effect of electroplating up from the seed layer, filling the relief patterns and ending with an irregular copper surface 35.

FIG. 3(f) shows the result of lapping or chemical mechanical polishing (CMP) of the copper surface, removing copper in the field areas 36, creating conductive traces 37, and also creating vias 38 as shown. Three power traces 37a, 37b, 37c are shown between each pair of ground vias 38a, 38b, corresponding to three power supplies required for components to be attached to the PWB; the number of distinct power traces can be adjusted as required. An advantage of this layout is that multiple power supplies are implemented on a single layer, while meeting the requirements of high speed circuits. Since power and ground traces are closely spaced, short traces can be used to connect them to power and ground pins of attached components. Thus, short traces can help provide a low impedance power distribution system (PDS). The lapping or polishing step also planarizes the surface, providing flatness that is desirable for close proximity masking at the next step. Typically a hard bake is used to harden both the first and second dielectric materials prior to lapping or polishing; this provides a stiffer film that can survive the applied mechanical forces. In FIG. 3(f) it can be seen that the bypass capacitors created between the power traces and copper substrate 22 (ground plane) benefit fully from the high-k material, with no compromises created by the grid lines, assuming judicious placement of traces with respect to the grid lines. Power distribution layer 23 of FIG. 2 is shown.

Figure 4:
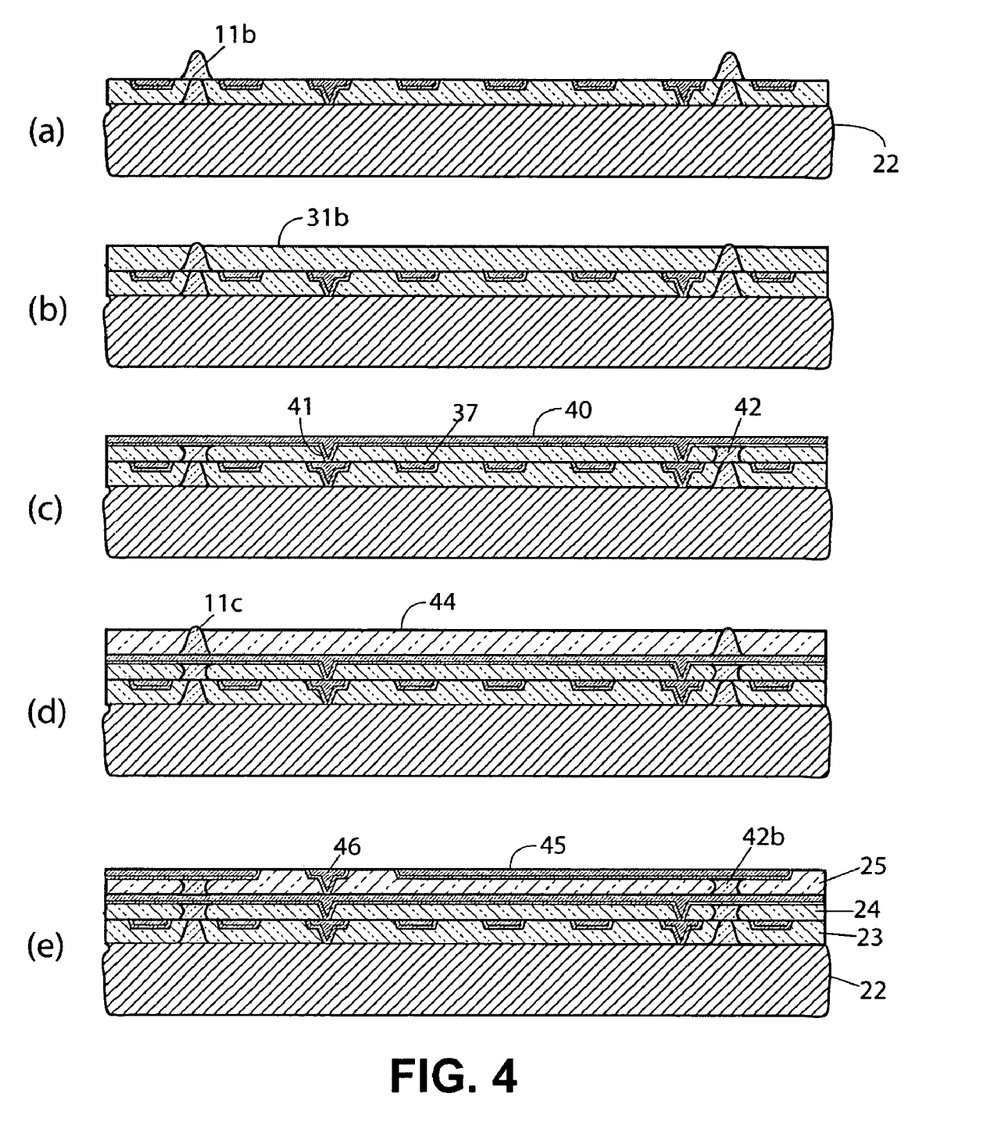
Figure 5:
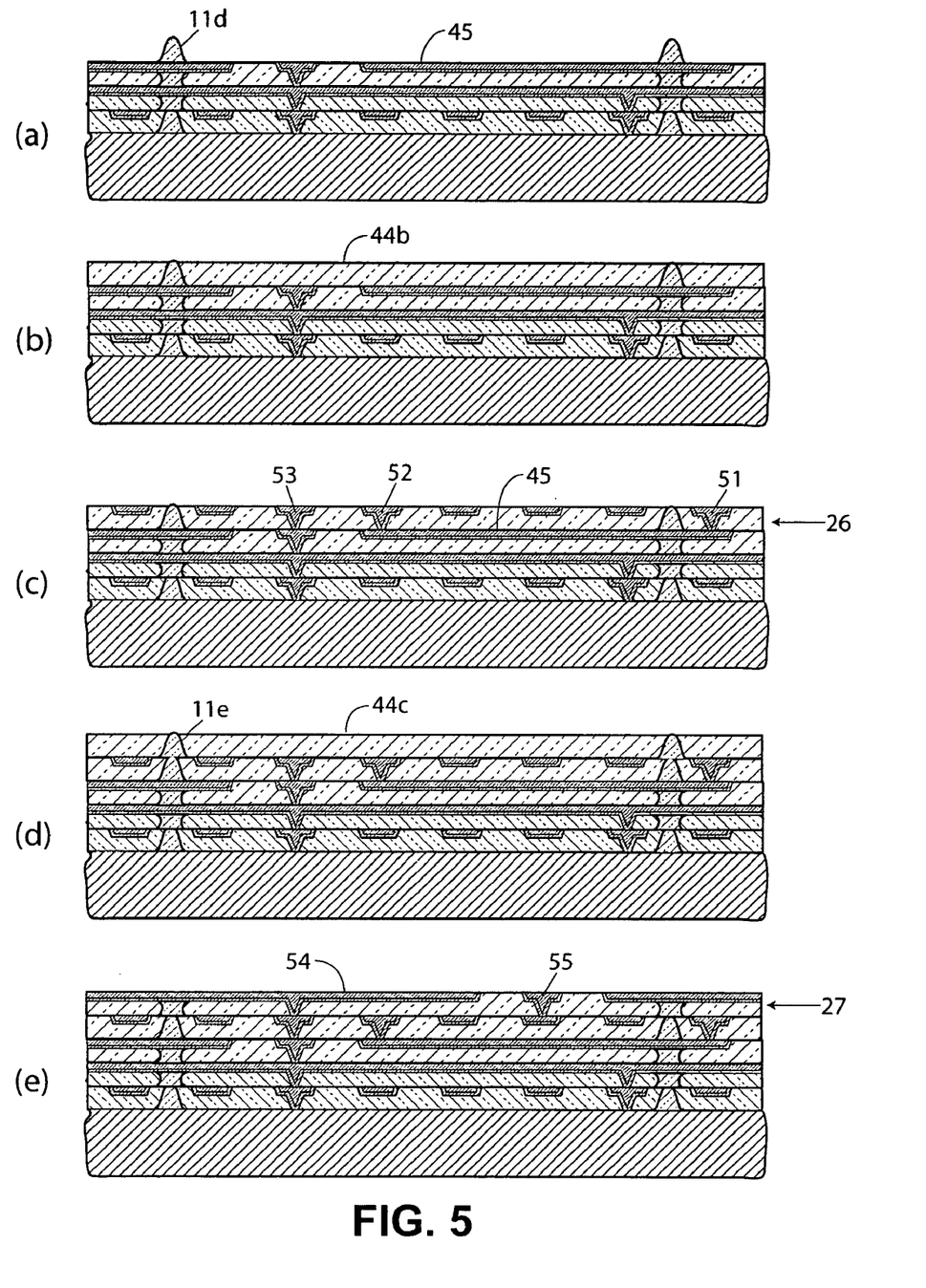
Figure 6:
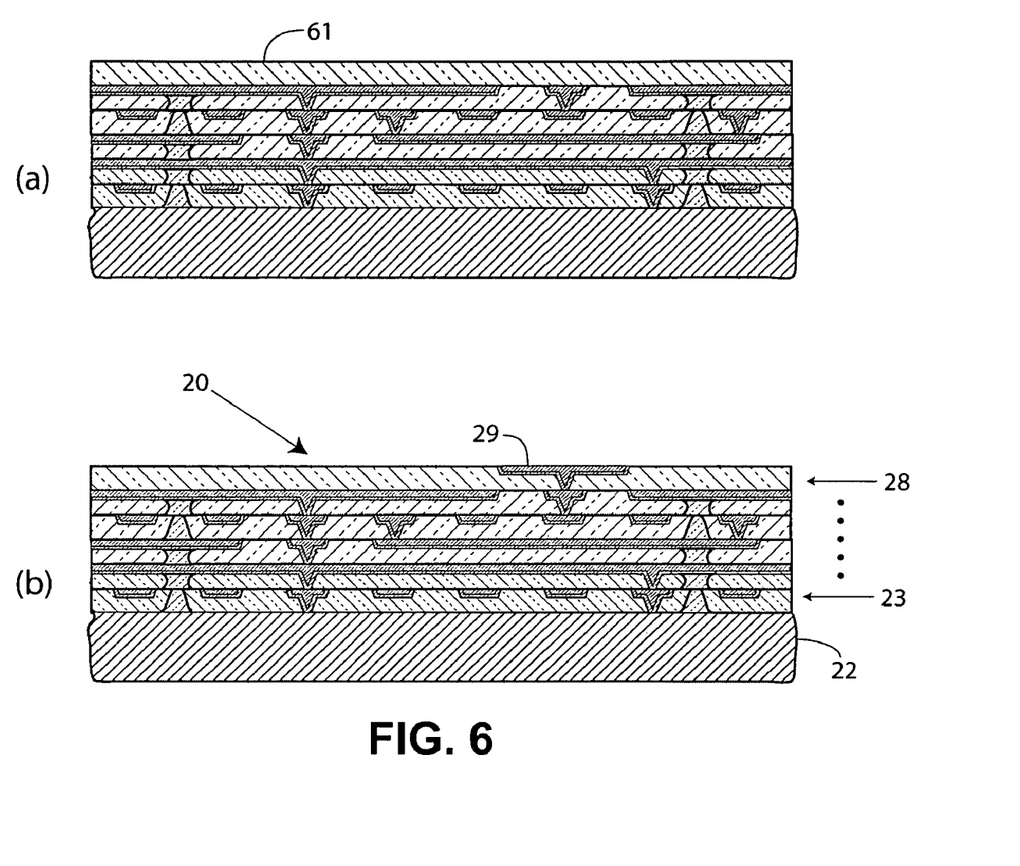

The processes depicted in FIGS. 4-6 follow the teachings of FIG. 3 with respect to forming grid lines and islands of dielectric material, creating trenches and vias using an embossing tool, and creating copper conductors by electroplating. FIG. 4(a) shows new grid lines 11b patterned as the foundation for a new dielectric layer which will become layer 24 of FIG. 2, defined as a ground plane. FIG. 4(b) shows that another layer 31b of high-k dielectric material has been spun on to the build-up substrate. FIG. 4(c) shows that a new layer of copper has been patterned to form ground conductor 40, with vias 41 penetrating down to contact ground traces on the previous layer. Power traces such as 37 pass between high-k dielectric on both sides, maximizing their bypass capacitance to ground conductors above and below. In FIGS. 3-6, the imprinting method is assumed for creating trenches and vias, although dry plasma etching could also be used. In FIG. 4(c), grid line 42 has been deformed as shown by the imprinting action of an embossing tool. Deformation occurs because the embossing tool is made of a hard material like nickel and grid lines 11b are relatively soft, having been soft-baked but not hard baked. In the case of plasma etched trenches, no such deformation would occur.

FIG. 4(d) shows an additional tiled dielectric layer formed from grid lines 11c and second material 44 which has been switched from a high-k to a low-k dielectric material because this is to be a signal layer. The preferred low-k material for all of the interconnection structures described herein is Cytop, with properties defined in Table 1. FIG. 4(e) shows patterning of signal layer 25 with conductive traces 45 running in the x-direction. Again, grid line 42b has been deformed by the imprinting action that formed trace 45. Ground via 46 is also shown.

FIG. 5 continues the process sequence. FIG. 5(a) shows a new set of grid lines 11d formed on top of the build-up substrate. FIG. 5(b) shows second material 44b which again is a low-k dielectric material because this is a signal plane. FIG. 5(c) shows patterned copper conductors forming second signal plane 26 of FIG. 2. Traces 51 and 52 are orthogonal (in the y-direction) to trace 45 and connect together using trace 45 and connecting vias as shown. Ground via 53 is also shown.

FIG. 5(d) shows new grid lines 11e formed from the first dielectric material on top of the build-up structure and second material 44c is again formed in the islands defined by the grid lines. Material 44c is a low-k dielectric, again because layer 27 is a signal plane. FIG. 5(e) shows a ground plane 54 interrupted by a signal via 55.

FIG. 6 continues the processing sequence. FIG. 6(a) shows a spin-on dielectric coating 61 for pad layer 28 of FIG. 2. It is not important for this dielectric coating to be either high-k or low-k, so it can be chosen for processing convenience. PI 2731 is the preferred material because of its close CTE match to copper, as shown in Table 1. The drawn dimensions of FIGS. 2-6 are chosen for descriptive purposes and this obscures the dominant thickness of copper substrate 22. Since layers 23-28 are thin (around 10μ) compared with substrate 22 (around 600μ), the expansion behavior of the built-up substrate is dominated by the underlying copper member. The dielectric films will stretch or compress as required, with additional "urging" provided by the embedded copper conductors. Accordingly, the PI 2731 coating of layer 28 will be CTE-compatible with the film assembly underneath it and there is no requirement for a tiled construction at this layer. FIG. 6(b) shows completed PWB 20 of FIG. 2, including pad layer 28 with I/O pad 29. I/O pad 29 provides a terminal for connecting a surface-mount component to PWB 20.

In one embodiment, a layered assembly can be provided which includes a substrate having a first coefficient of thermal expansion, a first material having a second coefficient of thermal expansion that is substantially matched to the first coefficient and a second material having a third coefficient of thermal expansion that is substantially not matched to the first coefficient. The first material is formed into a grid of intersecting lines attached to the substrate and the second material is formed in islands contained by the grid lines of the first material. The grid lines of the first material and the islands of the second material form a layered binary composite on the substrate.

In another embodiment, a interconnection circuit can be provided which includes one or more dielectric layers formed as a tiled film construction in the interconnection circuit and conductive traces embedded in the dielectric layers.

From the foregoing it will be appreciated that, although specific embodiments of the invention have been described herein for purposes of illustration, various modifications may be made without deviating from the spirit and scope of the invention.

I claim:

1. A tiled layer construction formed on a substrate having a substantially planar substrate surface, the tiled layer construction comprising:
a first material having a first thermal coefficient of expansion forming intersecting grid lines on the substrate surface, the grid lines covering respective first portions of the substrate surface and defining second portions of the substrate surface, each respective second portion completely outlined by the grid lines; and,
a second material having a second thermal coefficient of expansion disposed on the respective second portions of the substrate and bounded by the respective grid lines.

2. The tiled layer construction of claim 1, wherein the tiled layer construction is repeated to form multiple layers of the tiled construction on the substrate.

3. The tiled layer construction of claim 2, further comprising embedded conductors having the tiled layer construction in one or more of the multiple layers.

4. The tiled layer construction of claim 3, wherein the multiple layers of the tiled construction and the embedded conductors in the one or more layers of tiled construction form an interconnection circuit.

5. The tiled layer construction of claim 1, wherein the first material is compatible with the substrate with respect to adhesion.

6. The tiled layer construction of claim 1, wherein the first material is compatible with the substrate with respect to the first thermal coefficient of expansion.

7. The tiled layer construction of claim 1, further comprising the substrate, the substrate comprising copper.

8. The tiled layer construction of claim 1, further comprising the substrate, the substrate comprising a semiconductor wafer.

9. The tiled layer construction of claim 1, wherein the second material is-comprises an amorphous fluoropolymer.

10. The tiled layer construction of claim 1, wherein the first and second materials have similar photolithographic properties or similar physical properties for ease of patterning the tiled layer construction in a single patterning step.

11. The tiled layer construction of claim 1 wherein the grid lines formed from the first material provide structural support for subsequent planarization of the tiled layer using a chemical-mechanical-polishing process.

12. The tiled layer construction of claim 1 wherein the first and second materials comprise respective different dielectric materials.

13. The tiled layer construction of claim 1 wherein the grid lines include a first plurality of parallel grid lines oriented in a first direction along the substrate surface and a second plurality of parallel grid lines oriented in a second direction along the substrate surface such that the first plurality of parallel grid lines intersect the second plurality of parallel grid lines.

14. The tiled layer construction of claim 13 wherein the first direction is orthogonal to the second direction.

* * * * *